(12) United States Patent
Ahmad (10) Patent No.: US 7,205,786 B2
(45) Date of Patent: Apr. 17, 2007

(54) PROGRAMMABLE OUTPUT BUFFER (75) Inventor: Adeel Ahmad, Lucknow (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 0 days.

(21) Appl. No.: 10/832,091

(22) Filed: Apr. 26, 2004

(65) Prior Publication Data
US 2005/0001653 A1 Jan. 6, 2005

(30) Foreign Application Priority Data
Apr. 25, 2003 (IN) .............................. 633/Del/03

(51) Int. Cl.
*H03K 19/003* (2006.01)
(52) U.S. Cl. .......................... 326/30; 326/33; 326/34; 326/26
(58) Field of Classification Search ............ 326/26–27, 326/30–34, 87; 327/170, 107–112
See application file for complete search history.

(56) References Cited

U.S. PATENT DOCUMENTS

| | | | | |
|---|---|---|---|---|
| 5,898,321 A | * | 4/1999 | Ilkbahar et al. | 326/87 |
| 6,288,563 B1 | * | 9/2001 | Muljono et al. | 326/27 |
| 6,538,464 B2 | * | 3/2003 | Muljono et al. | 326/27 |
| 6,710,617 B2 | * | 3/2004 | Humphrey | 326/30 |
| 6,919,738 B2 | * | 7/2005 | Kushida | 326/82 |

* cited by examiner

*Primary Examiner*—Anh Q. Tran
(74) *Attorney, Agent, or Firm*—Lisa K. Jorgenson; E. Russell Tarleton; Seed IP Law Group PLLC (57) ABSTRACT

A programmable output buffer providing variable drive strength and slew rate for a given noise limit that includes a driver stage that generates the output of the buffer and a plurality of selectively enabled switching elements, at least a predriver stage providing a plurality of selectable switching elements that enables the selected drive stage switching elements, and a selection means that enables the required predriver switching elements in the desired sequence to provide the desired drive strength and slew rate.

40 Claims, 7 Drawing Sheets

FIG1: Prior Art (refer to U.S. Pat. no.- 5926651, Fig. 3)

PROGRAMMABLE OUTPUT BUFFER

BACKGROUND OF THE INVENTION

1. Field of the Invention

The invention relates to an output buffer and, more particularly, a programmable output buffer with variable driving strengths and variable slew rate.

2. Description of the Related Art

Output buffers in CMOS integrated circuits are used to couple data and control signals to external pins that need to drive different types of load, typically capacitive in nature, hence the output transition timing are dependent on the capacitance value of the load and the driving strength of output buffer. For driving a large capacitive load, the output buffer needs to have larger output drive strength that allows larger current to be sinked and sourced by the load for smaller output transition times. A smaller drive strength would increase the output transition times. On the other hand for a small capacitive load, the output buffer requires only a small output drive strength, and a higher drive strength buffer driving a small load would generate large transient currents resulting in large undesired ground and power bounce in the supply rails and ringing in the system. Also, it dissipates extra power that must be avoided as integrated circuits become smaller and faster. Therefore, an output buffer with programmable driving strength is required such that a desirable output drive strength can be selected depending on the load attached to the output pin. Further, a slew rate limit option is implemented in an output buffer that allows it to operate in slow systems with low noise and ringing.

Figure 1:
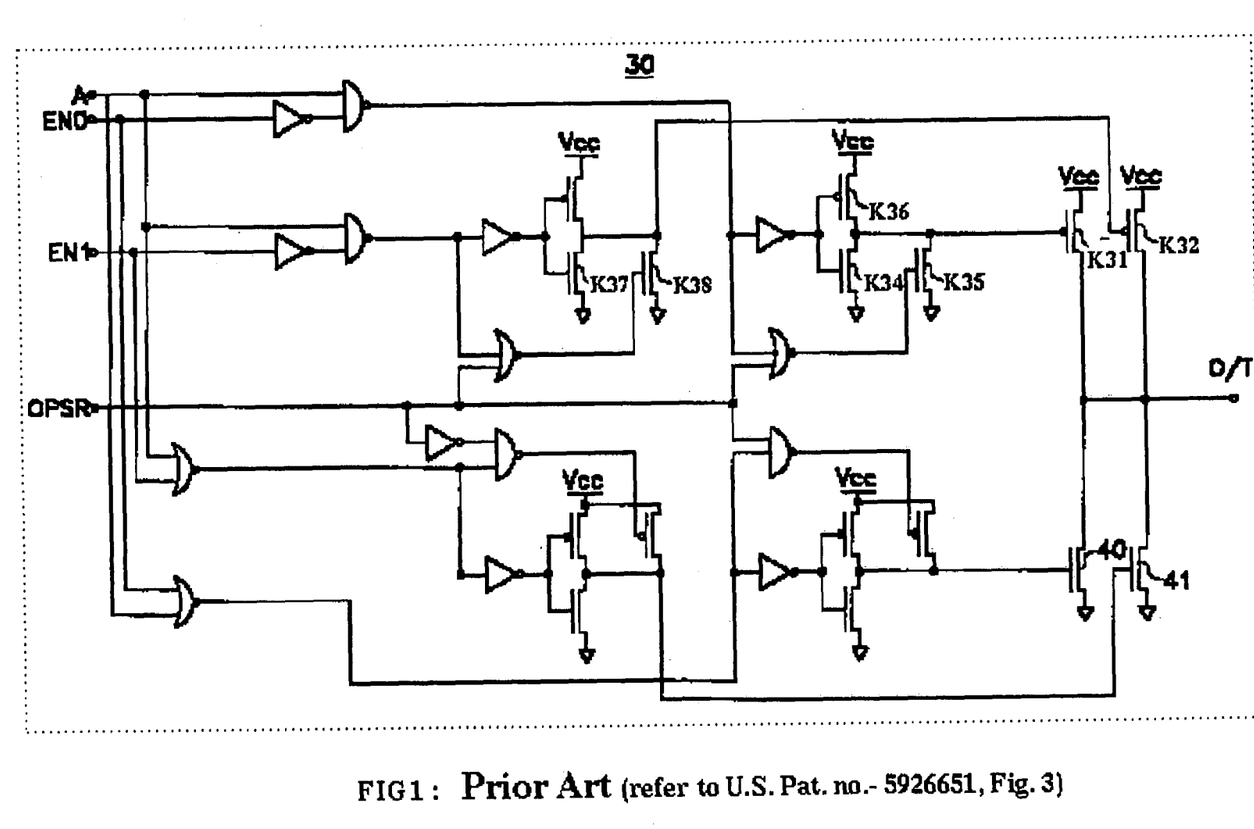
FIG. 1 shows a prior art output buffer in accordance with the U.S. Pat. No. 5,926,651.

FIG. 1 shows an embodiment in accordance with the U.S. Pat. No. 5,926,651. In this circuit, predrivers made of transistors K34, K35, K36, K37 and K38 control the pull-up drive strength. Switching on transistor K31 gives one value of drive strength (say KX), switching on transistor K32 gives another drive strength (say KY) while switching on both transistors K31 and K32 sets the output buffer with a different drive strength (KX+KY). Thus, the user can select one of the three different driving strengths. Also, the circuit provides variable slew rate for each driving strength by controlling the speed of the switching of driver transistors K31 and K32. For each of the driving strength, two slew rate variations are available.

In all such circuits, the maximum noise is generated for higher driving strengths in a fast slew rate option since larger currents are sinked and sourced. As driving strength is reduced, the output delays degrade and the noise reduces since now smaller currents are sourced and sinked. Whereas in case of a slow slew rate the output delays further deteriorate.

This implies that the output delays and supply noise vary widely for various drive strengths and slew variations, and that for lower driving strengths the delays are worse while noise is much lower than the maximum noise that the system can tolerate.

BRIEF SUMMARY OF THE INVENTION

The disclosed embodiments of the invention provide output delays for all driving strengths comparable to the smallest delay that occurs for maximum driving strength without generating any extra noise and to minimizing the noise generated for higher driving strengths. In addition, the invention controls output delays by optimizing delays and noise for various driving strengths and slew rates. The invention further provides, for different driving strengths and slew rates, an optimal balance between the output delays and the noise generated.

For example, in case of lower driving strengths, the output delays and noise can be optimized by speeding up the voltage transitions at the gate of driver transistors while allowing the noise to rise up to the maximum tolerable limits, which would make the output delays for all driving strengths comparable to the smallest delay that occurs for maximum driving strength. This is done at the cost of some extra noise generation at the supply rails but the noise for lower driving strengths will still remain lesser than the maximum noise that is produced with highest driving strength. In slow slew option too, the output delays can be optimized by speeding up operation for lower driving strengths while maintaining the noise at lower levels.

Accordingly, the invention provides a programmable output buffer providing variable drive strength and slew rate for a given noise limit that includes a driver stage that generates the output of the buffer and includes a plurality of selectively enabled switching elements; a predriver stage providing a plurality of selectable switching elements that enables the selected drive stage switching elements; and a selection circuit that enables the required predriver switching elements in the desired sequence to provide the desired drive strength and/or slew rate.

The number of selected driver stage switching elements is determined by the required drive strength and their switching sequence is controlled to optimize the switching noise and delay.

The number and sequence of selected switching elements in the predriver stage is determined by the combination of the desired drive strength and/or slew rate.

The selection circuit is in one embodiment a bit pattern generator.

The predriver stage comprises a pull down predriver stage driving the pull down switching elements of the driver stage and a pull up predriver stage driving the pull up switching elements of the driver stage.

The noise includes ground bounce and supply bounce noise.

The sequential turning on of selected elements is achieved by selecting appropriate paths incorporating different delay elements.

The pull up switching elements of the driver stage are parallel to each other and connected between the first terminal of the power supply and the output of the driver stage.

The pull down switching elements of the driver stage are parallel to each other and connected between the second terminal of the power supply and the output of the driver stage.

The switching elements are pass transistors with their control terminals separately connected to the output of the said predrivers.

The predriver includes a selector receiving inputs from the said selection means, data input and providing a first output lines, each output line is further provided with a additional circuitry for increasing/decreasing speed, to supply desired slew rate.

The invention further provides a method to provide a programmable output buffer providing variable drive strength and slew rate for a given noise limit that includes the steps of providing a driver stage that includes a plurality of selectively enabled switching elements for generating the output of the buffer; connecting a predriver stage to a plurality of selectable switching elements that enables the selected drive stage switching elements; and enabling the required predriver switching elements in the desired sequence to provide the desired drive strength and/or slew rate using a selection means.

The above method further includes determining the number of selected driver stage switching elements by the required drive strength and controlling the switching sequence to optimize the switching noise and delay.

The above method further includes determining the number and sequence of selected switching elements in the predriver stage by the combination of the desired drive strength and/or slew rate.

The above method further includes connecting the pull up predriver stage to the pull up switching elements of the driver stage and a pull down predriver stage to the pull down switching elements of the driver stage.

The above method also includes achieving the sequential turning on of selected elements by selecting appropriate paths incorporating different delay elements.

The above method further includes connecting the pull up switching elements of the driver stage in parallel to each other between the first terminal of the power supply and the output of the driver stage.

The above method further includes connecting pull down switching elements of the driver stage in parallel to each other between the second terminal of the power supply and the output of the driver stage.

In accordance with another embodiment of the invention, a programmable output buffer is provided that includes a driver stage having a plurality of selectively-enabled switching elements configured to generate an output signal that is the output of the buffer; a pull-up predriver stage coupled to a first set of inputs in the driver stage; a pull-down predriver stage coupled to a second set of inputs in the driver stage; a bit pattern generator coupled to the pull-up predriver stage and the pull-down predriver stage and configured to generate a pattern of bits for selectively enabling selectable switching elements in the pull-up predriver stage and the pull-down predriver stage.

BRIEF DESCRIPTION OF THE SEVERAL VIEWS OF THE DRAWINGS

The disclosed embodiments of the present invention will now be described in accordance with the accompanying drawings.

DETAILED DESCRIPTION OF THE INVENTION

Figure 2:
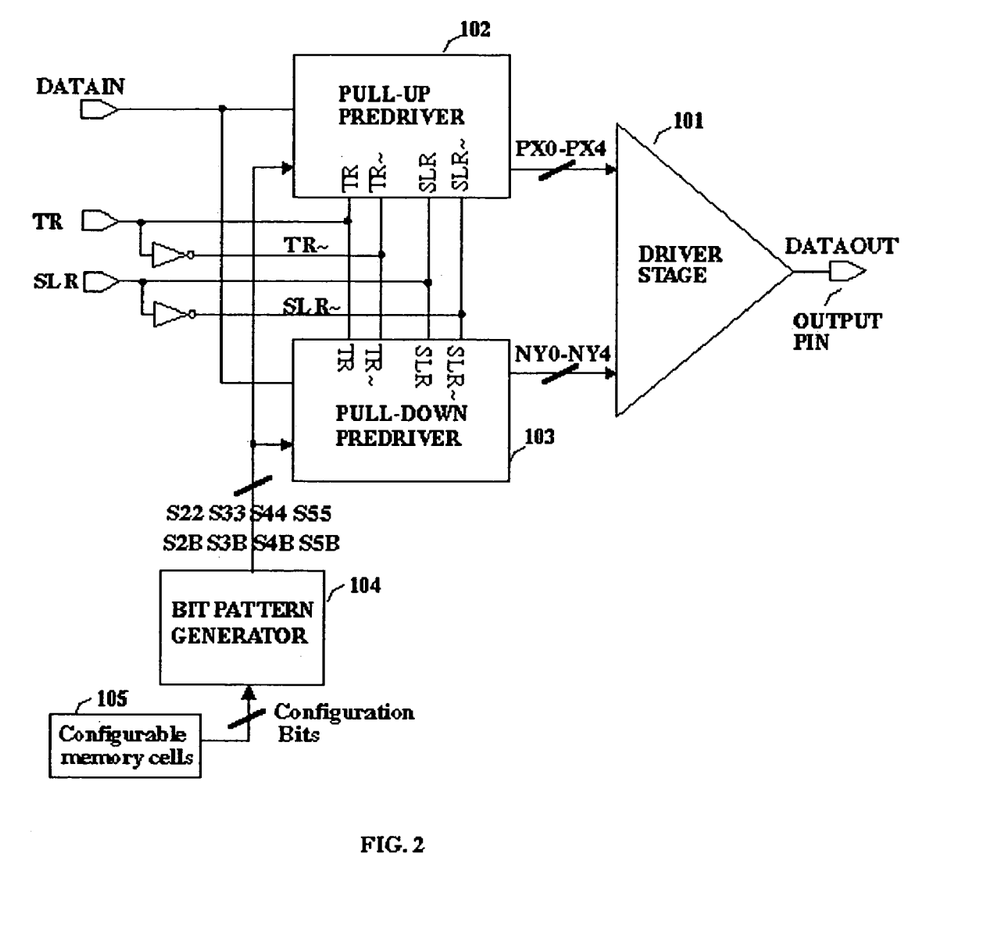
FIG. 2 shows a block diagram of a programmable output buffer according to the present invention.

Referring to FIG. 2, shown therein is an embodiment of programmable drive strength output buffer in accordance with an embodiment of the present invention. The instant invention provides a tri-state output buffer with variable slew rate. The output buffer includes a pull-up predriver 102 and a pull-down predriver 103 having their outputs PX-PX4 and NY0-NY4 driving a driver stage 101. The predrivers have control signals TR, SLR, TR~, and SLR~ and receive input data DATAIN and a bit configuration pattern from a bit pattern generator 104. The bit pattern generator 104 generates the bit pattern depending upon the input it receives from a configuration memory cell 105.

The output pin of the driver stage is left floating with all the transistors within the driver stage switched off when the control signal TR is high. When the control signal TR is low, the output buffer is enabled and data at the DATAIN is transmitted to the output pin at a selected output drive strength and slew rate. The slew select signal SLR determines the speed of output transition and noise generated by the driver. The SLR is set to high for enabling the slew limit option, and the inputs to the transistors of driver stage 101 are shaped to provide the slew limited output. The predrivers 102 and 103 keep output slew limited without making the buffer operation slow. For the low SLR, the output buffer operates in a fast mode and maintains the fast switching transistors of the driver stage 101 without generating excessive ground noise and without exhausting excessive power.

The output buffer ensures optimum speed in all cases of different driving strengths and slew options, i.e., when higher driving strengths are selected, the inputs to the driver stage 101 transistors are slowed down to prevent large power and ground bounce in the supply rails without degrading the speed. Similarly for the lower drive strengths, the inputs to drive stage transistors are made fast to get maximum speed response comparable to the speed with higher driving strengths to offset the additional delay due to reduced driving strength. Also for a slew limited case, the inputs of the driver stage transistors are shaped to minimize ground bounce without degrading output transition time.

To select the required driving strength for the output buffer, specific bit patterns are required by the predrivers 102 and 103. A Bit Pattern Generator 104 generates the required bit patterns. The output buffer is programmed to drive the output load with a specific drive strength by feeding the Bit Pattern Generator 104 with a set of Configuration Bits that would generate the required bit pattern for the desired driving strength. This bit pattern is fed into the predrivers 102 and 103 that, along with other control signals TR and SLR, selectively switch the various transistors of the driver stage 101. Following is a Truth Table showing the bit patterns for selecting different drive strengths.

TABLE 1

| Driving strength I in mA | TR | S22 | S33 | S44 | S55 |
|---|---|---|---|---|---|
| Tristated | 1 | | X(don't care) | | |
| I | 0 | 1 | 1 | 1 | 1 |
| 2I | 0 | 0 | 1 | 1 | 1 |
| 3I | 0 | 0 | 0 | 1 | 1 |
| 4I | 0 | 0 | 0 | 0 | 1 |
| 5I | 0 | 0 | 0 | 0 | 0 | where S22, S33, S44, S55 are the output of the bit pattern generator 104.

The Bit Pattern Generator 104 can use different techniques to generate the aforementioned bit patterns for selecting the various driving strength options. One way to select one of the various driving strength options is to directly feed the configuration bits into the predrivers as S22, S23, S24, and S55, which would also reduce the Bit Pattern Generator circuitry. This technique requires the total number of configuration bits be equal to the total number of different driving options. The number of required configuration bits can be reduced by using various combinations of (logn/log2) Configuration Bits for generating 'n' different bit pattern for different driving options, which is by adding circuitry to the Bit Pattern Generator 104. For example, three different Configuration Bits CB1, CB2 and CB3 in different combinations can generate bit patterns for a maximum of 8 driving options.

Figure 3:
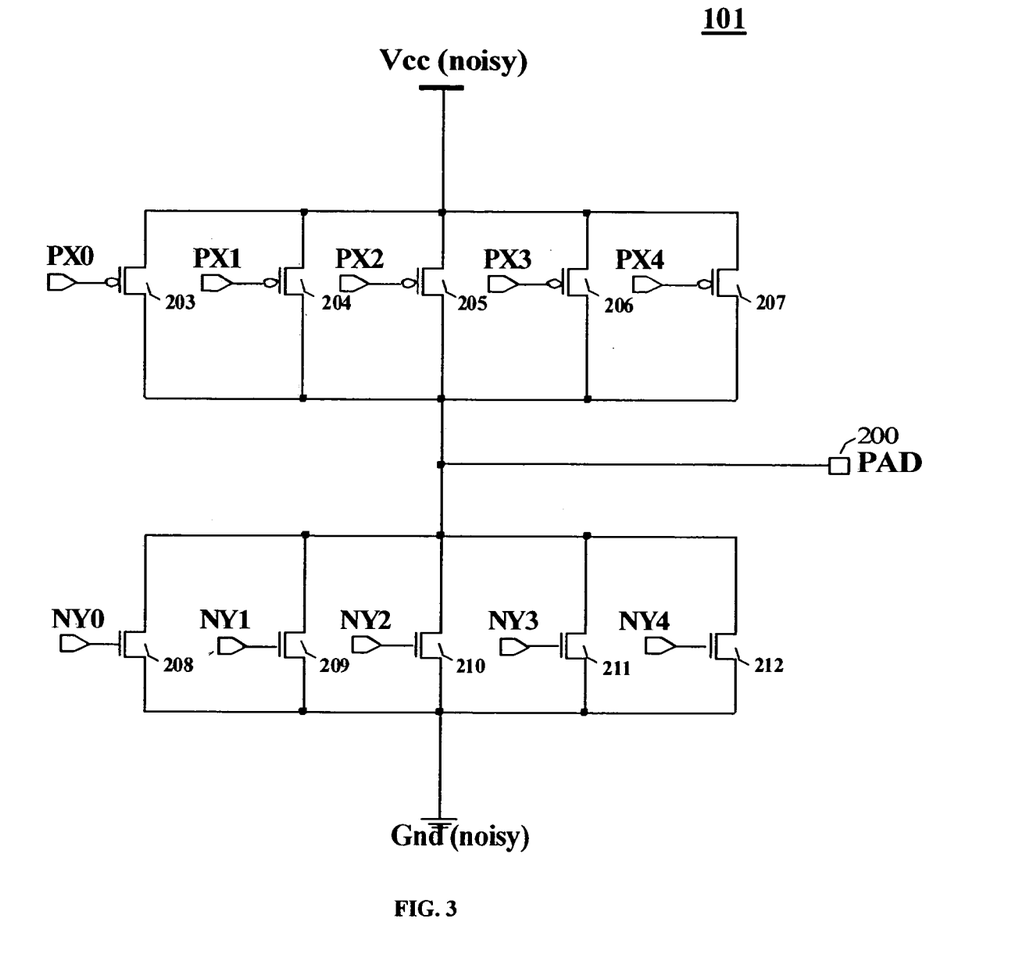
FIG. 3 shows a driver stage for the programmable output buffer of FIG. 2.

FIG. 3 shows the driver stage 101 in detail. Pad 200 is the output of the output buffer. The pad 200 is pulled up by switching on the pull-up PMOS transistors 203, 204, 205, 206, and 207. The PMOS transistors 203, 204, 205, 206, and 207, each having a pre determined current driving capacity (for example X), are placed in parallel, connected between the output pad 200 and the supply Vcc. The NMOS transistors 208, 209, 210, 211, and 212, again each having a pre-determined current driving capacity (for example "Y") are placed in parallel, connected between the output pad 200 and a noisy ground supply Gnd. The inputs PX0 PX1, PX2, PX3, and PX4 to the pull-up PMOS driver transistors 203 204, 205, 206, and 207 are obtained from the pull-up predriver 102 and the inputs NY0, NY1, NY2, NY3, and NY4 to the pull-down NMOS driver transistors 208 209, 210, 211, and 212 are obtained from the pull-down predriver 103. An inherent parasitic package inductance is always present at the power supply terminals, which results in a noisy power supply during the switching of the output 200. The instant invention provides an optimization of this and other noises to improve the performance of the output driver. Depending on the input from the bit pattern configuration the driving strength is selected, which switches on a different number and different combinations of the driver transistors. To turn on pull-up transistors 203, 204, 205, 206, and 207 of the driver stage, their respective gate voltages PX0, PX1, PX2, PX3, and PX4 are pulled to low. During pull-up of the output, all the NMOS transistors of the driver are switched off. For turning on pull-down transistors 208, 209, 210, 211, and 212 of the driver stage, their respective gate voltages NY0, NY1, NY2, NY3, and NY4 are pulled to high. During pull-down of the output, all the PMOS transistors of the driver are switched off.

Figure 4:
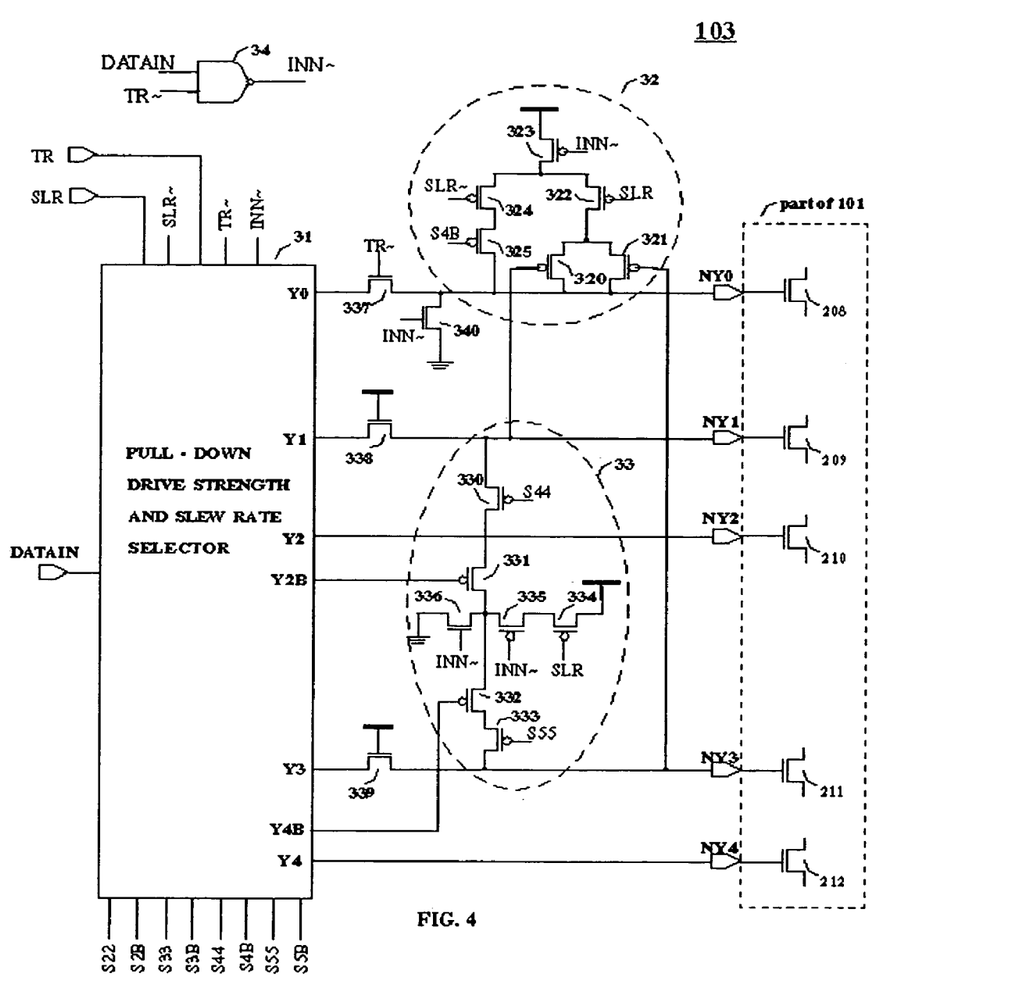
FIG. 4 shows a pull-down predriver.

FIG. 4 illustrates the pull-down predriver 103 in detail. A pull-down drive strength and slew rate selector block 31 of the pull-down predriver 103 receives the data, DATAIN and control signals SLR, SLR~, TR, and TR~. The programming bit pattern S22, S23, S24, and S55 and their complementary bits S2B, S3B, S4B, and S5B are also inputs to the block 31. The control signals TR~ and SLR~ are the inverted TR and SLR respectively. The tristate option is enabled when the signal TR is high, TR~ goes low and output of NAND gate 34, INN~=1 independent of DATAIN. This switches off transistor 337 and switches on transistor 340 to pull down line NY0. The selector block 31 also pulls the NY0, NY1, NY2, NY3, and NY4 to low switching off all the pull-down driver transistors. On the other hand, for a low control signal TR, TR~ goes high and the tristate option is disabled and the output of NAND gate 34, INN~ is inverted DATAIN. This allows DATAIN in to pass through the Selector block 31 and the predriver functions normally. Depending on the drive strength and slew rate selected, different number and combinations of the five outputs Y0, Y1, Y2, Y3, and Y4 of the block 31 switch on that select the desired pull-down strength and slew rate of the output buffer in the following manner.

TABLE 2

| Driving Strength | Enabled outputs | Disabled outputs |
|---|---|---|
| Tristated | — | Y0 Y1 Y2 Y3 Y4 |
| Y(Slew) | Y0 | Y1 Y2 Y3 Y4 |
| Y(Fast) | Y0 | Y1 Y2 Y3 Y4 |
| 2Y(Slew) | Y0 Y1 | Y2 Y3 Y4 |
| 2Y(Fast) | Y0 Y2 | Y1 Y3 Y4 |
| 3Y(Slew) | Y0 Y1 Y3 | Y2 Y4 |
| 3Y(Fast) | Y0 Y2 Y4 | Y1 Y3 |
| 4Y(Slew) | Y0 Y1 Y3 Y2 | Y4 |
| 4Y(Fast) | Y0 Y2 Y4 Y1 | Y3 |
| 5Y(Slew) | Y0 Y1 Y3 Y2 Y4 | — |
| 5Y(Fast) | Y0 Y2 Y4 Y1 Y3 | — |

Since outputs Y0, Y1, Y2, Y3, and Y4 of the block 31 are connected to the outputs NY0, NY1, NY2, NY3, and NY4 respectively, the enable/disable status for NY's is exactly the same as those for Y's shown in Table 2. The Y0 responds fastest to DATAIN, the response of Y1 and Y3 is the slowest, while the response of Y2 and Y4 is intermediate. Therefore, as observed in Table 2, for slew-limit option, the slower Y's, i.e., Y1 and Y3, are first switched on followed by faster ones while for the fast option, the faster Y's, i.e., Y2 and Y4, are first switched on followed by slower ones The slower Y's, i.e., Y1 and Y3, are provided additional pull-up circuits for fast output option. For slew limited output option, the NY1 and NY3, which are slower outputs of the pull-down predriver, are preferably switched on while NY2 and NY4, which are faster outputs of the pull-down predriver, are switched on only for higher driving strengths. On the other hand, for the fast output option, the faster NY2 and NY4 are preferably switched on while the slower NY1 and NY3 are switched on only for higher driving strengths. This technique ensures that for the slew limit case, the output is slew limited and generates minimum noise while for the fast option, the output response speed is maximized, allowing some more noise on the ground rail but keeping it within tolerable limits. The NY0 is switched on for any driving strength and responds fastest to DATAIN transition so the NY0 is most critical in controlling ground bounce and speed.

When the slew limited is selected for low driving strengths and DATAIN is going high, the NY0 is pulled up to Vcc for driving strengths of Y, 2Y, and 3Y at a speed at which the noise is minimized and also the output transition is not delayed excessively. However, NY0 is not allowed to rise very fast as the sudden rise forces the output pull-down driver transistors to switch quite fast, generating ground bounce more than the tolerable limit in the fast case. To reduce this noise level, the pull-down predriver of the present invention employs two paths to pull-up NY0. Initially, NY0 is pulled up towards Vcc−Vtn with NY0 following the Y0 through the pass transistor 337 and rising gradually. After a delay, another pull-up circuit 32 starts pulling-up the NY0 to Vcc. However, for higher driving strengths, since the number of driver transistors that are switching is already high, there is no need for additional pull-up as the output delays are already reduced, and if NY0, which is most critical in generating noise, is not restricted to Vcc−Vtn, it will increase noise levels beyond tolerable limits for the slew case.

When limited slew is selected for driving strengths of 2Y and higher and DATAIN is going high, Y1 is switched high after Y0, pulling up NY1 to Vcc−Vtn. For driving strengths of 3Y and higher, with DATAIN going high, Y3 is also switched high after Y0 pulling up NY3 to Vcc−Vtp. The pull-up of NY1 and NY3 to Vcc−Vtn after a delay ensures a minimized noise even for driving strengths of Y, 2Y and 3Y.

For driving strengths higher than 3Y in the slew limited case, the NY2 and NY4 are switched on but with a further delay with respect to NY1 and NY3, respectively. The NY2 and NY4 are pulled up to Vcc for the slew limit as well as for the fast option. The switching of NY2 and NY4 is helpful in the slew limit case even though their transition is to Vcc and faster than NY1 and NY3 because the switching of the slower NY0, NY1, and NY3 already have ensured a very small noise generation in the ground rail so the NY2 and NY4 help speed up the output transition with only a small increase in ground bounce.

For the fast output option and lower driving strengths, when DATAIN is going high, the NY0 is pulled-up faster than in the slew limited case by pulling up the NY0 to Vcc at a faster rate. However, NY0 is not allowed to rise very fast as a sudden raise forces the output pull-down driver transistors to switch very fast, generating large ground bounce that gets coupled to all the circuits sharing the same ground rails. To prevent a sudden rise, the pull-down predriver of the present invention employs two paths to pull-up NY0. Initially, NY0 is pulled-up towards Vcc−Vtp with NY0 following the Y0 through the pass transistor 337 and rising gradually, charging the gate capacitance of the driver NMOS transistor 208 exponentially. After a specific delay, another pull-up circuit 32 starts pulling-up the NY0 to Vcc. As driving strength increases, the need for additional pull-up of the NY0 reduces, since the number of driver transistors pulling down the output is already higher, resulting in greater noise being generated at the ground rail. So for driving strengths of 4Y, the strength of pull-up of the circuit 32 is reduced. For maximum driving strength of 5Y, the circuit 32 is completely switched off.

This technique therefore ensures that for lower driving strengths, the NY0 which is most critical in generating ground bounce and in determining the output delays is pulled up fast enough to reduce output delays. For higher driving strengths, when more driver stage pull-down transistors of the output buffer are switched on and ground bounce is already near its maximum tolerable limit, there is no need to further speed up the transition of NY0, and therefore circuit 32 is either partially or completely switched off, depending on the driving strength selected. Also, for higher driving strengths in the fast output option, the NY0 and NY1, which are slower and rise only up to Vcc−Vtn, need to be switched faster and up to Vcc to improve the output transition time. For this, another pull-up circuit 33 is used for pulling-up the NY1 and NY3. The circuit 32 provides the additional pull-up for NY0 required for fast output option for lower driving strengths, and circuit 32 also provides additional pull-up for the slew limited output option for lower driving strengths.

When SLR=1, i.e., when the fast output option is chosen, the circuit 32 is enabled for lower driving strengths and disabled for higher driving strengths. For driving strengths of Y, 2Y, and 3Y transistor 324 switches on since SLR~=0, and transistor 325 is also on since S4B=0, which allows NY0 to rise faster to Vcc that helps reduce output delays for lower driving strengths with minimum noise generation. For higher driving strengths, the circuit 32 is disabled and NY0 rises to Vcc−Vtn gradually due to large gate capacitance of the pull-down transistor 208. This gradual rise to voltage Vcc−Vtn ensures that the ground bounce generated by switching the driver stage NMOS transistor 208 is minimized.

When SLR=0, i.e., for the fast output option, the circuit 32 is enabled for low driving capability. For driving Y, 2Y, and 3Y strengths, Y1 and Y3 are both held at low, and transistors 320 and 321 of circuit 32 are on. This switches on circuit 32 and enhances the speed of rise in NY0, and now the NY0 rises up to Vcc and at a faster speed. For a driving strength of 4Y, however, the transistor 320 is switched off since Y1 also rises to Vcc, but transistor 321 is still on. This reduces the speed at which circuit 32 pulls up NY0 to Vcc. This reduction in speed of pull-up by circuit 32 is done since the driving strength is already large. If NY0 is pulled up at the same high speed as is done for lower driving strengths, the ground bounce would increase considerably. For 5Y driving strength, the circuit 32 is completely disabled by switching off transistors 320 and 321 since driving strength is already large enough so that any further enhancement to the transition of NY0 would increase noise on ground rails beyond tolerable limits.

The circuit 33 also provides an additional pull-up path for NY1 and NY3 for the fast output option for higher driving strengths. For the driving strength of 4Y, in case of the slew limited option, NY1 rises only up to Vcc−Vtn, while for driving strength of 4Y and 5Y, both NY1 and NY3 rise only up to Vcc−Vtn due to the NMOS transistor 338 between Y1 and NY1 and transistor 339 between Y3 and NY3. This, in the slew limited option, is helpful for minimizing noise generation by restricting gate voltages of switching driver transistors, i.e., NY1 and NY3 only to Vcc−Vtp and the gate voltage rising slowly due to presence of pass transistors 338 and 339. In the fast option, the circuit 33 ensures that the NY1 and NY3 are pulled up to Vcc through two paths. Initially the NY1 and NY3 rise towards Vcc−Vtn due to pass transistors 338 and 339 following the rise in Y1 and Y3. After a small delay, an additional pull-up circuit 33 starts to pull up NY1 towards Vcc for 4Y driving strength and pull up both NY1 and NY3 towards Vcc for 5Y driving strength.

When SLR=0, transistor 334 goes on, and with DATAIN=1, INN~=0 transistor 335 goes on and transistor 336 goes off. Now if the driving strength is less than 4Y, the NY1 and NY3 are held at low voltage and are not being used. Hence circuit 33 requires no pull-up action and turning off transistors 330 and 333 makes circuit 33 off since S44 and S55 are both high for driving strength less than 4Y. For the driving strength of 4Y, NY1 needs to be pulled up faster to Vcc for the fast output option. The transistor 331 is on since Y2B goes low with DATAIN=1 for all driving strengths higher than Y, and transistor 330 is also on since the 4Y selection bit S44=0. This enables an additional pull-up path for NY1. Similarly for the 5Y driving strength, both NY1 and NY3 need to be pulled up faster to Vcc so for fast option, transistors 332 and 333 are also on. The transistor 332 is on since Y4B goes low when DATAIN=1 for all driving strengths higher than 2Y, and transistor 333 also goes on since the 5Y selection bit, S55=0. This enables an additional pull-up path for NY3 apart from enabling NY1. When DATAIN is going low, the pull-down NMOS transistors 208, 209, 210, and 211 are switched off to allow the output of the output buffer to be pulled up to high by the driver stage PMOS pull-up transistors. Thus, with the tristate option disabled, i.e., TR~=1 and input data, DATAIN=0, the signal INN~=1 is fed into the selector block 31 which pulls down its outputs Y1 through Y4 to low which, in turn, pulls NY1, NY2, NY3, and NY4 to low. The Y0 is also pulled down by switching on transistor 340, since INN~=1. This turns off all the driver stage pull-down transistors of driver stage 101. Proper sizing of transistors of circuits 32 and 33 determine the speed of additional pull-up of NY0, NY1, and NY3 for fast output option. Further the sizes of transistors 337, 338, and 339 are kept small enough to ensure that voltages at NY0, NY1, and NY3 rise slower than voltage rise at NY2 and NY4.

Figure 5:
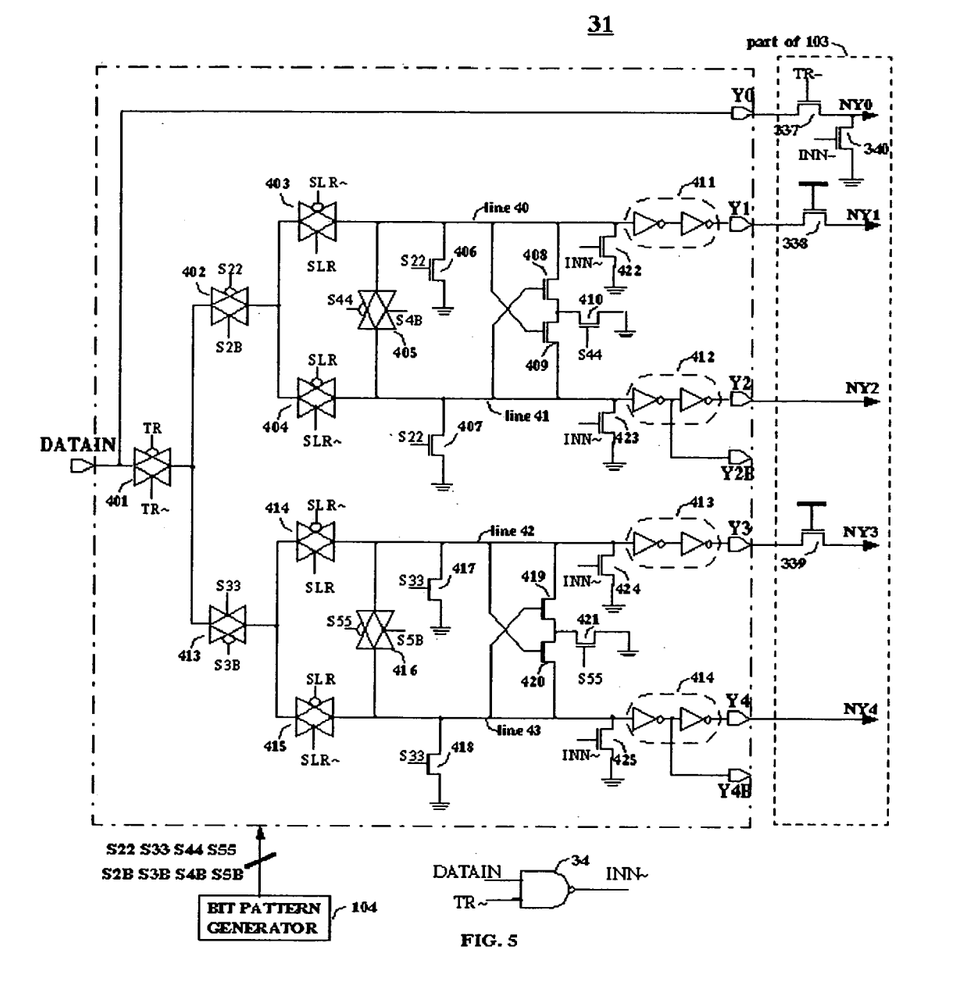
FIG. 5 shows a pull-down drive strength and slew rate selector block.

FIG. 5 illustrates the pull-down drive strength and slew rate selector in detail. The selector consists of five distinct lines, each of which drives one of the five pull-down NMOS driver stage transistors. This block provides the right combination of pull-down driver transistors to switch on with appropriate delays between the switching of each driver transistor, for a specific bit pattern generated by the Bit pattern Generator 104 as described in Table 2. The pull-down drive strength and slew rate selector 31 provides five different outputs Y0, Y1, Y2, Y3, and Y4 and two other signals Y2B and Y4B which are inverted Y2 and inverted Y4 respectively. The input to the Selector 31 is the data DATAIN required at the output, connected directly to the block Y0 without any intermediate circuit. All the other branches are controlled by transmission gates that control the flow of DATAIN through the four lines Y1, Y2, Y3, and Y4 depending on the tristate signal, TR and the bit pattern generated for defining the driving strength of the output buffer.

When TR=1, the tristate option is enabled and the transmission gate 401 switches to off and thereby disconnects DATAIN from rest of the circuit 31 except Y0. The signal INN~ output from NAND gate 34 is high and switches on the transistors 422, 423, 424 and 425 thereby pulling down the outputs Y0, Y1, Y2, Y3 and Y4 to 0V. The output Y0 being directly connected to DATAIN goes out of the selector block 31 through a transistor 337 that switches off when TR=1 and the line NY0 is pulled to low by transistor 340. This disables all pull-down driver transistors when the tristate option is enabled.

For TR=0 and DATAIN=0, the output of the NAND INN~ is high turning transistors 422, 423, 424, and 425 to on, thereby pulling down the outputs Y1, Y3, Y2, and Y4 of the selector block 31 to 0V while Y0 is also forced to 0V with transistor 340 switching off the pull-down driver stage transistors. In this case pull-up driver stage transistors pull up the output at output pin.

When TR=0, and DATAIN going high, the DATAIN goes to transmission gates 402 and 413. The bit S22 of the bit pattern generated by the Bit Pattern Generator 104 controls the transmission gate 402 while the bit S33 controls the transmission gate 413. For driving strengths higher than Y, S22=0 and transmission gate 402 switches to on. Similarly, for a driving strength higher than 2Y, S33=0 and transmission gate 413 switches to on.

From the Table 2 it is clear that outputs of the selector 31 is enabled and switch with DATAIN in the order—Y0, Y1, Y3, Y2 and Y4 with increasing order of driving strengths from Y to 5Y for the slew limited case, while for the fast case, outputs of the Selector 31 get enabled and switch with DATAIN in the order—Y0, Y2, Y4, Y1, and Y3 with increasing order of driving strengths from Y to 5Y.

For the slew limited output option when SLR=1 and DATAIN=1, for driving strength of Y, the transmission gate 401 is disabled so only Y0 switches with DATAIN irrespective of the slew option selected. Bits S22, S33, S44, and S55 are all high so transistors 406, 407, 417, and 418 all go on and pull to low the outputs Y1, Y2, Y3, and Y4, respectively. So only Y0 switches to high following the input signal DATAIN=1.

For driving strength of 2Y, transmission gate 401 is enabled along with transmission gate 402 since bit S22=0 while bits S33, S44 and S55 are high. For SLR=1, transmission gate 403 is on so line 40 goes high since DATAIN=1, pulling Y1 high, and Y0 is also high. Also, the transistor 410 is on since S44=1 and transistor 409 is on as line 40 is high which pulls the line 41 to low. This switches Y2 to low and Y2B to high. Since S33=1, transmission gate 413 is off while transistors 417 and 418 are on, pulling line 42 and 43 to low, and Y3 and Y4 also remain low. Since line 42 and 43 are both low, transistors 419 and 420 are both off. Y0 and Y1 switch to high following the input signal DATAIN=1.

For a driving strength of 3Y, transmission gates 401, 402, and 413 are enabled and bits S44 and S55 are high. Since SLR is high, transmission gates 403 and 414 are on and hence Y1 and Y3 are at high, and Y0 follows the DATAIN. The transistor 410 is on since S44=1 and transistor 409 is on as line 40 is high, which pulls line 41 low and results in a low Y2 and high Y2B. Similarly, transistors 420 and 421 are on which pulls the line 43 to low. This switches Y4 to low and Y4B to high. So Y0, Y1, and Y3 switch to high following the input signal DATAIN=1.

For a driving strength of 4Y, transmission gates 401, 402, and 413 are enabled and the bit S55 high. Since SLR is high, transmission gates 403 and 414 become on, pulling line 40 and line 42 to high switching Y1 and Y3 to high, and Y0 follows DATAIN. The transmission gate 405 is on since S44=0, pulling line 41 to high thereby switching Y2 to high. The output Y2 is switched to high by transmission gate 405 after Y1 pulls to high. The transistor 410 is switched off since S44=0. Further, the transistor 421 is on since S55=1 and transistor 420 is on as line 42 is high which pulls the line 43 to low. This switches Y4 to low and Y4B to high. So Y0, Y1, Y2, and Y3 switch to high following the input signal DATAIN=1.

For a driving strength of 5Y, transmission gates 401, 402, and 413 are enabled, and the node Y1 and Y3 are high, while Y0 follows DATAIN. Since S44=0 and S55=0, transmission gates 405 and 416 also go on pulling line 41 and line 43 to high thereby switching Y2 and Y4 to high. The output Y2 is switched to high by transmission gate 405 after Y1 pulls to high. The output Y4 is switched to high by transmission gate 405 after Y3 pulls to high. The transistors 410 and 421 are switched off since S44=0 and S55=0. Hence Y0, Y2, Y4, Y1, and Y3 switch to high following the input signal DATAIN=1.

When the SLR=0, DATAIN=1 and the fast output option is chosen, in such case for driving strength of Y, transmission gate 401 is disabled so only Y0 switches with DATAIN irrespective of slew option selected. The bits S22, S33, S44 and S55 are all high so transistors 406, 407, 417, and 418 all are on and pull to low the outputs Y1, Y2, Y3, and Y4 respectively. Hence Y0 switches to high following the input signal DATAIN=1.

For a driving strength of 2Y, transmission gates 401 and 402 are enabled. The control signal SLR=0 and hence transmission gate 404 passes DATAIN to line 41, pulling Y2 to high, and Y0 follows DATAIN. The line 41 switches on the transistor 408, and since S44=1 transistor 410 is also conducting, which pulls down the line 40. Since S33=1, transmission gate 413 is off while transistors 417 and 418 are on, pulling line 42 and 43 to low, so Y3 and Y4 also fall to low. Since line 42 and 43 are both low, transistors 419 and 420 are both off. Y2B and Y4B, being complementary of Y2 and Y4 respectively, are pulled to low. Hence Y0 and Y2 switch to high following the input signal DATAIN=1.

For a driving strength of 3Y, transmission gates 401, 402 and 413 are enabled and bits S44 and S55 are high. Since SLR is low, transmission gates 404 and 415 are on and hence Y2 and Y4 switch to high, and Y0 follows the DATAIN. The transistor 410 is on since S44=1 and transistor 408 is on as line 41 is high, which pulls the line 40 to low. Similarly, transistor 421 is on since S55=1 and transistor 419 is on as line 43 is high, which pulls the line Y3 to low. Y2B and Y4B, being complementary of Y2 and Y4 respectively, are pulled to low. Hence Y0, Y2 and Y4 switch to high following the input signal DATAIN=1.

For a driving strength of 4Y, transmission gates 401, 402, and 413 are enabled and bit S55 being high. Since SLR is low, transmission gates 404 and 415 become on, pulling line 41 and line 43 to high switching Y2, and Y4 to high, while Y0 follows the DATAIN. Since S44=0, transmission gate 405 is on, pulling line 40 to high and thereby switching Y1 to high. The output Y1 is switched to high by transmission gate 405 after Y2 pulls to high. The transistor 410 is switched off since S44=0. Further the transistor 421 is on since S55=1 and transistor 419 is on as line 43 is high, which pulls the line 42 to low. This switches Y3 to low. Hence Y0, Y2, Y4, and Y1 switch to high following the input signal DATAIN=1.

For a driving strength of 5Y, transmission gates 401, 402, and 403 are enabled. The nodes Y2 and Y4 are high, and Y0 follows the DATAIN. Since S44=0 and S55=0, transmission gates 405 and 416 also go on, pulling line 40 and line 42 to high, thereby switching Y1 and Y3 to high. The output Y1 is switched to high by transmission gate 405 after Y2 pulls to high. Similarly output Y3 is switched to high by transmission gate 405 after Y4 pulls to high. The transistors 410 and 421 are switched off since S44=0 and S55=0. Hence Y0, Y1, Y3, Y2, and Y4 switch to high following the input signal DATAIN=1.

The sizes of buffer stages and the transmission gates determine the speed at which signal on lines 40, 41, 42, and 43 reach the outputs Y1, Y2, Y3 and Y4 of the selector 31. Hence, the sizes of transmission gates 403 and 414 and sizes of buffer stage 411 and 413 determine response in slew limit case and is kept small enough to prevent fast switching of the driver stage transistors that would otherwise cause large bounce in the ground rail. The size of the transmission gates 404 and 415 and the size of the buffer stage 412 and 414 is kept large enough so that the signal transmitted to the gate of pull-down driver transistors is faster but its size is limited by amount of ground bounce that is tolerable in the system. The sizes of the transmission gates 405 and 416 are kept small enough to provide the desired skew between Y1 and Y2 and between Y3 and Y4.

Figure 6:
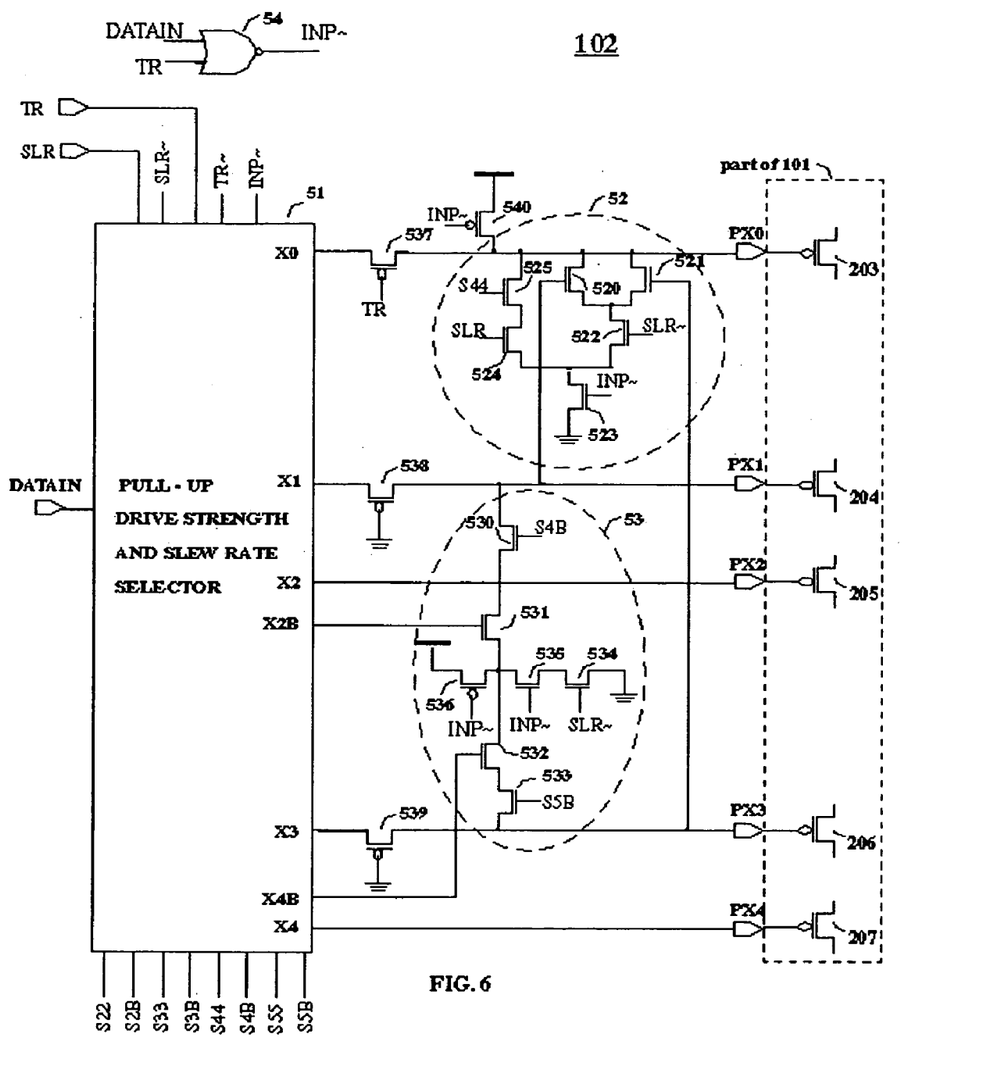
FIG. 6 shows a pull-up predriver.

FIG. 6 illustrates the pull-up predriver 102 in detail. The pull-up drive strength and slew rate selector block 51 of the pull-up predriver receives the data, DATAIN required at the output and the control signals TR, TR~, SLR and SLR~. The control signals TR~ and SLR~ are the inverted TR and SLR respectively. The programming bit pattern S22, S23, S24, and S55 and their complementary signals S2B through S5B are the inputs to the block 51. The tristate option is enabled when the control TR is high and the output INP~ of NOR gate 54 is low and independent of DATAIN. This switches off transistor 537 and switches on transistor 540 to pull up line PX0. The selector block 51 also pulls the PX1, PX2, PX3, and PX4 to high, switching off all the pull-up driver transistors. On the other hand, for a low control signal TR the tristate option is disabled and the output of NOR gate 54, INP~ is inverted DATAIN. This allows DATAIN in to pass through the selector block 51 and the predriver functions normally. Depending on the drive strength and slew rate selected, the different number and combinations of the five outputs X0, X1, X2, X3 and X4 of the block 51 switch on that select the desired pull-up strength and slew rate of the output buffer in the following manner.

TABLE 3

| Driving Strength | Enabled Outputs | Disabled Outputs |
| --- | --- | --- |
| Tristated | — | X0 X1 X2 X3 X4 |
| X(Slew) | X0 | X1 X2 X3 X4 |
| X(Fast) | X0 | X1 X2 X3 X4 |
| 2X(Slew) | X0 X1 | X2 X3 X4 |
| 2X(Fast) | X0 X2 | X1 X3 X4 |
| 3X(Slew) | X0 X1 X3 | X2 X4 |
| 3X(Fast) | X0 X2 X4 | |
| 4X(Slew) | X0 X1 X3 X2 | X4 |
| 4X(Fast) | X0 X2 X4 X1 | X3 |
| 5X(Slew) | X0 X1 X3 X2 X4 | — |
| 5X(Fast) | X0 X2 X4 X1 X3 | — |

Since all the outputs X0, X1, X2, X3, and X4 of the block 51 are connected to the outputs PX0, PX1, PX2, PX3, and PX4 respectively, the enable/disable status for PX's is exactly the same as those for X's shown in Table 3. The X0 responds fastest to the DATAIN, the response of X1 and X3 is the slowest while the response of X2 and X4 is intermediate. For the slew limited option, the slower X's are first switched on followed by faster ones, while for the fast option, the faster X's are first switched on followed by slower ones. The slower X's are provided additional pull-down circuits for faster pull-down. Therefore, for a slew limited output option, the PX1 and PX3, which are slower outputs of the pull-up predriver, are preferably switched on while PX2 and PX4, which are faster outputs of the pull-up predriver are switched on for higher driving strengths. On the other hand, for fast output option, the faster PX2 and PX4 are preferably switched on while slower PX1 and PX3 are switched on for higher driving strengths. This technique ensures that for the slew limit case, the output is slew limited and generates minimum noise. For the fast option, the output response speed is maximized allowing some more noise on the power rail but keeping it within tolerable limits. The PX0 is switched on for any driving strength and responds fastest to DATAIN transition so the PX0 is most critical in controlling ground bounce and speed.

When the limited slew is selected for low driving strengths and DATAIN is going low, the PX0 is pulled-down at a speed at which the noise is minimized ensuring that the output transition is not delayed excessively. This is achieved by pulling up the PX0 to ground for driving strengths of X, 2X and 3X. However, PX0 is not allowed to drop very fast since a sudden drop forces the output pull-up driver transistors to switch quite fast, generating power bounce more than the tolerable limit allowed in fast case. To reduce this noise level, the pull-up predriver of the present invention employs two paths to pull-down PX0. Initially, PX0 is pulled down towards Vtp with PX0 following the X0 through the pass transistor 537, falling gradually. After a delay, another pull-down circuit 52 starts pulling-down the PX0 to 0V. However, for higher driving strengths, since the number of driver transistors that are switching is already high, there is no need for additional pull-down as the output delays are already reduced. If PX0, which is most critical in generating noise, is not restricted to Vtp, it will increase noise levels beyond tolerable limits for slew case.

In the slew limited case for driving strengths of 2X and higher, when DATAIN is going low, X1 switches to low after X0, pulling down PX1 to Vtp. For driving strengths of 3X and higher, when DATAIN is going low, X3 also switches to low after X0 pulling down PX3 to Vtp. The pull-down of PX1 and PX3 to Vtp after a delay ensures a minimized noise even for driving strengths of X, 2X, and 3X.

For driving strengths higher than 3X in the slew limited case, the faster PX2 and PX4 switch on but with a further delay with respect to PX1 and PX3 respectively. The PX2 and PX4 are pulled down to 0V for slew limit as well as for fast option. The switching of PX2 and PX4 is helpful in the slew limit case even though their transition is to 0V and faster than PX1 and PX3 because the switching of slower PX0, PX1, and PX3 already have ensured less noise generation in the power rail so the PX2 and PX4 help speed up the output transition with only a small increase in power bounce.

For fast output option and lower driving strengths, when DATAIN goes low, the PX0 pulled-down faster than in the slew limited case. However, PX0 is not allowed to fall very fast since sudden change forces the output pull-up driver transistors to switch very fast generating large power bounce that gets coupled to all the circuits sharing the same power rails. To prevent this, the pull-up predriver of the present invention employs two paths to pull-down PX0. Initially, PX0 is pulled down towards Vtp with PX0 following the X0 through the pass transistor 537 and falling gradually, discharging the gate capacitance of the driver PMOS transistor 203 exponentially. After a specific delay, another pull-down circuit 52 starts to provide an additional pull-down means for the PX0. However, as driving strength increases, the need for additional pull-down of the PX0 reduces since the number of driver transistors pulling up the output is already higher, resulting in greater noise being generated at the power rails.

For driving strengths of 4X, the strength of pull-down of circuit 52 is reduced. For maximum driving strength of 5X, the circuit 52 is completely switched off.

This technique therefore ensures that for lower driving strengths, the PX0 which is most critical in generating power bounce and in determining the output delays, is pulled down fast enough to reduce output delays, while for higher driving strengths, when more driver stage pull-up transistors of the output buffer are already switched on and power bounce is already near its maximum tolerable limit, there is no need to further speed up the transition of PX0. Therefore circuit 52 is either partially or completely switched off, depending on the driving strength selected. Further for higher driving strengths in the fast output option, the PX0 and PX1, which are slower and fall only up to Vtp need to be switched faster and down to 0V to improve the output transition time, which is by providing another pull-down circuit 53 for pulling-down the PX1 and PX3. The circuit 52 provides the additional pull-down for PX0 for the fast output option for lower driving strengths. Also the circuit 52 provides additional pull-down for slew limited output option for lower driving strengths.

When SLR=1, the circuit 52 is enabled for lower driving strengths and disabled for higher driving strengths. For driving strengths of X, 2X, and 3X, transistor 524 and 525 are on, which allows PX0 to fall faster to 0V that helps reduce output delays for lower driving strengths with minimum noise generation. For higher driving strengths, the circuit 52 is disabled, and PX0 falls to Vtp gradually due to large gate capacitance of the pull-up transistor 203. This gradual fall to voltage Vtp ensures that the power bounce generated by switching the driver stage PMOS transistor 203 is minimized.

When SLR=0, i.e., for fast output option, circuit 52 is enabled for low driving capability. For driving strengths of X, 2X, and 3X strengths X1 and X3 are both held at high and so transistors 520 and 521 are on. This enhances the speed of fall in PX0, and now the PX0 falls down to 0V and at a faster speed. For a driving strength of 4X, however, the transistor 520 is switched off since X1 also falls to 0V, but transistor 521 is still on. This reduces the speed with which circuit 52 pulls down PX0 to 0V. This reduction in speed of pull-down by circuit 52 is done since driving strength is already large, and if PX0 is pulled down with same high speed as done for lower driving strengths, the power bounce would increase considerably. For 5X driving strength, the circuit 52 is completely disabled by switching off transistors 520 and 521 since driving strength is already large enough. Any further enhancement to the transition of PX0 would increase noise on power rails considerably. The circuit 53 also provides an additional pull-down path for PX1 and PX3 for fast output option for higher driving strengths. For a driving strength of 4X, PX1 falls only to Vtp. For a driving strength of 4X and 5X, both PX1 and PX2 fall only to Vtp in case of slew limited option due to on PMOS transistor 538 between X1 and PX1 and transistor 539 between X3 and PX3. This, the slew limited option is helpful in minimizing noise generation by restricting gate voltages of switching driver transistors, i.e., PX1 and PX3 only to Vtp and the gate voltage falling slowly due to presence of pass transistors 538 and 539.

In the fast option, the circuit 53 ensures that the PX1 and PX3 are pulled down to 0V through two paths. Initially the PX1 and PX3 fall towards Vtp following the fall in X1 and X3. But after a small delay, additional pull-down circuit 53 starts to pull down PX1 towards 0V for 4X driving strength, and pull down both PX1 and PX3 faster towards 0V for 5X driving strength.

When SLR=0 transistor 534 is on and when the DATAIN is going low, transistor 535 is on and transistor 536 is off. If driving strength is less than 4X, the PX1 and PX3 are held at a high voltage and are not being used. Hence circuit 53 requires no pull-down action, and transistors 530 and 533 are off.

For a driving strength of 4X, PX1 needs to be pulled down faster to 0V for the fast output option. The transistor 531 is already on since X2B turns high and DATAIN=0 for all driving strengths higher than X and transistor 530 also goes on since inverted of the 4X selection bit in the bitstream, S4B=1. This enables an additional pull-down path for PX1. Similarly for the 5X driving strength, both PX1 and PX3 are pulled down faster to 0V. For the fast option, transistors 532 and 533 also turn on. The transistor 532 is already on since X4B goes high with DATAIN=0 for all driving strengths higher than 2X, and transistor 533 also goes on since the inverted of the 5X selection bit in the bitstream S5B=1. This enables an additional pull-down path for PX3. When DATAIN is going high, the pull-up PMOS transistors 203, 204, 205, 206, and 207 of the driver stage 101 are required to be switched off to allow the output of the output buffer to be pulled down to low by the driver stage NMOS pull-down transistors. Thus, with the tristate option disabled, i.e., TR=0 and input data, DATAIN=1, the signal INP~=0 is switched to low, or 0V by the NOR gate 54. Thus for INP~=0, the transistors 540, 541, 542, 543, and 544 are switched on and pull to high all the inputs, PX0, PX1, PX2, PX3, and PX4, turning off all the driver stage pull-up transistors.

Figure 7:
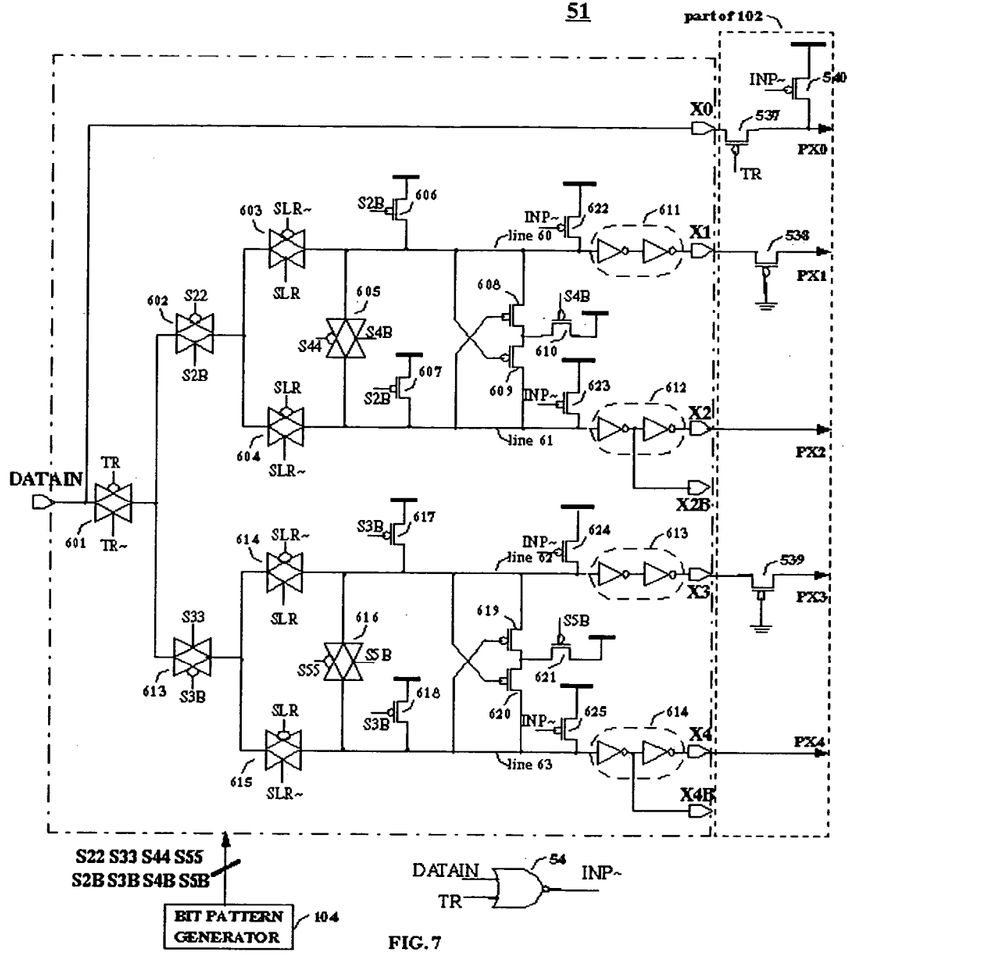
FIG. 7 shows a pull-up drive strength and slew rate selector block.

FIG. 7 illustrates the pull-up drive strength and slew rate selector 51 in detail. The selector 51 consists of 5 distinct lines, each of which drives one of the five pull-up PMOS driver stage transistors. This block is for combining right pull-up driver transistors with appropriate delays for a specific bit pattern generated by the Bit pattern Generator 104. The selector 51 provides outputs as X0, X1, X2, X3, X4 and signals X2B and X4B, which are inverted X2 and inverted X4, respectively. The inputs to selector 51 are the configuration bits S22, S2B, S33, S3B, S44, S4B, S55, and S5B from the bit pattern generator 104 and the data DATAIN. The first output from the block X0 is directly obtained from DATAIN without any intermediate circuit. All the other branches are controlled by transmission gates that control the flow of DATAIN through the four lines X1, X2, X3, and X4 depending on the tristate signal, TR, and the bit pattern generated for defining the driving strength of the output buffer.

When TR=1, the tristate option is enabled, and the transmission gate 601 switches to off, thereby disconnecting DATAIN from rest of circuit 51 except X0. The signal INP~ output from NOR gate 54 goes low and switches the transistors 622, 623, 624, and 625 to on, thereby pulling up the outputs X0, X1, X2, X3 and X4 of the selector block 51 to Vcc. The output X0 being directly connected to DATAIN goes out of the selector block 51, but it is also inhibited by a pass transistor 537 that switches off when TR~=0 and the line PX0 is pulled to high by transistor 540. With the control signal TR=0 and DATAIN going low, the pull-up predriver is enabled and the DATAIN goes to transmission gates 602 and 613. The bit S22 of the bit pattern generated by the Bit Pattern Generator 104 controls the transmission gate 602, while the bit S33 controls the transmission gate 613. For driving strengths higher than X, S22=0 and transmission gate 602 switches to on. Similarly, for a driving strength higher than 2X, S33=0 and transmission gate 613 switches to on.

From Table 3 it is clear that the outputs of the selector 51 get enabled and switch with DATAIN in the order—X0, X1, X3, X2, and X4 with increasing order of driving strengths from X to 5X for the slew limited case, while outputs of the selector 51 get enabled and switch with DATAIN in the order—X0, X2, X4, X1 and X3 with increasing order of driving strengths from X to 5X for the fast case.

When TR~=1 and DATAIN=1, the output of the NOR gate INP~ is low, turning transistors 622, 623, 624, and 625 on, thereby pulling up the outputs X1, X2, X3, and X4 of the selector block 51 to Vcc while X0 is also raised high by transistor 540.

For the slew limited output case, when SLR=1 and DATAIN=0, for driving strength of X, transmission gate 601 is disabled and X0 switches with DATAIN irrespective of slew option selected. Bits S22, S33, S44 and S55 are all high so transistors 606, 607, 617 and 618 all go on and pull to high the outputs X1, X2, X3 and X4 respectively. X0 switches to low following the input signal DATAIN=0.

For a driving strength of 2X, transmission gate 601 is enabled along with transmission gate 602 since bit S22=0, while bits S33, S44, and S55 are high. Since SLR=1, transmission gate 603 is on and DATAIN=0, line 60 goes low pulling X1 to low, X0 already being low. The transistor 610 is on since S44=1 and transistor 609 is on as line 60 is low, which pulls the line 61 high. This switches X2 to high and X2B to low. Since S33=1, the transmission gate 613 is off, while transistors 617 and 618 are on pulling line 62 and 63 to high, and X3 and X4 also rise to high. Since line 62 and 63 are both low, transistors 619 and 620 are both off. Hence X0 and X1 switch to low following the input signal DATAIN=0.

For a driving strength of 3X, transmission gates 601, 602, and 613 are enabled and bits S44 and S55 are high. While SLR=1, transmission gates 603 and 614 are on and hence the nodes X1 and X3 switch to low and follow the input signal DATAIN=0, X0 also being pulled to low. The transistor 610 is on since S44=1 and transistor 609 is on as line 60 is low, which pulls the line 61 high. This switches X2 to high and X2B to low. Similarly, transistor 621 is on since S55=1 and transistor 620 is on as line 62 is low, which pulls the line 63 high. This switches X4 to high and X4B to low. Providing X0, X1 and X3 low following the input signal DATAIN=0.

For a driving strength of 4X, transmission gates 601, 602, and 613 are enabled and bit S55 being high. When SLR=1 and DATAIN=0 transmission gates 603 and 614 become on pulling line 60 and line 62 to low switching X1 and X3 to low, X0 also being low. Since S44=0, transmission gate 605 also goes on pulling line 61 to low thereby switching X2 to low. The output X2 is switched to low by transmission gate 605 after X1 pulls to low. The transistor 610 is switched off since S44=0. The transistor 621 is on since S55=1 and transistor 620 is on as line 62 is low which pulls the line 63 high. This switches X4 to high and X4B to low. Hence X0, X1, X2, and X3 switch to low following the input signal DATAIN=0.

For a driving strength of 5X, transmission gates 601, 602, and 613 are enabled and S55 bit is low. The nodes X1 and X3 switch to low following the input signal DATAIN=0, X0 also being low. Since S44=0 and S55=0, transmission gates 605 and 616 goes on pulling line 61 and line 63 to low, thereby switching X2 and X4 to low. The output X2 is switched to low by transmission gate 605 after X1 pulls to low. Similarly, output X4 is switched to low by transmission gate 605 with some delay after X3 pulls to low. Transistors 610 and 621 are switched off since S44=0 and S55=0. Providing X0, X2, X4, X1, and X3 low following the input signal DATAIN=0.

For the fast output case when SLR=0 and DATAIN=0, and for a driving strength of X, transmission gate 601 is disabled only X0 follows DATAIN irrespective of slew option selected. Bits S22, S33, S44 and S55 are all high, and transistors 606, 607, 617 and 618 all go on and pull to low the outputs X1, X2, X3 and X4 respectively, hence providing the X0 low following the input signal DATAIN=0.

For a driving strength of 2X, transmission gate 601 is enabled along with transmission gate 602 since bit S22=0, while bits S33, S44, and S55 are high. With SLR=0, the transmission gate 604 is on, pulling down line 61 by connecting DATAIN and pulling X2 to low, X0 is low as it follows DATAIN. The transistor 610 is on since S44=1 and transistor 608 is on as line 61 is low, which pulls the line X1 high. Since S33=1, transmission gate 613 is off while transistors 617 and 618 are on, pulling line 62 and 63 to low, and X3 and X4 also remain high. Since line 62 and 63 are both low, transistors 619 and 620 are both off. X2B and X4B, being complementary of X2 and X4 respectively, are pulled low, hence providing X0 and X2 to switch low following the input signal DATAIN=0.

For a driving strength of 3X, transmission gates 601, 602, and 613 are enabled, since bits S22 and, S33 are low while bits S44 and S55 are high. With the control signal SLR=0, transmission gates 604 and 615 are on and X2 and X4 switch to low and follow the input signal DATAIN=0, with X0 also being pulled to low. Also, a transistor 610 is on since S44=1 and transistor 608 is on as line 61 is low, which pulls the line X1 high. Similarly, transistor 621 is on since S55=1 and transistor 619 is on as line 63 is low, which pulls the line X3 high. The nodes X2B and X4B, being complementary of X2 and X4 respectively, are pulled to low. Hence providing X0, X2, and X4 switch to low following the input signal DATAIN=0.

For a driving strength of 4X, transmission gates 601, 602, and 613 are enabled and bit S55 is high. The control signal SLR=0, and DATAIN=0, transmission gates 604 and 615 become on pulling line 61 and line 63 to low and switching X2 and X4 to low, and X0 is low as it follows DATAIN. Since S44=0, transmission gate 605 switches on pulling net 60 to low, thereby switching X1 to low. The output X1 is switched to low by transmission gate 605 after X2 pulls to low. The transistor 610 is switched off since S44=0. The transistor 621 is on since S55=1 and transistor 619 is on as line 63 is low, which pulls the line X3 high. Hence providing X0, X2, X4 and X1 switch to low following the input signal DATAIN=0.

For a driving strength of 5X, transmission gates 601 and 602 are enabled and the bit S55 low. The nodes X1, X0, and X3 switch to low following the input signal DATAIN=0. Since S44=0 and S55=0, transmission gates 605 and 616 go on pulling net 60 and net 62 to low, thereby switching X1 and X3 to low. The output X1 is switched to low by transmission gate 605 after X2 pulls to low. Similarly output X3 is switched to low by transmission gate 605 with some delay after X4 pulls to low. The transistors 610 and 621 are switched off since S44=0 and S55=0. Hence providing X0, X1, X3, X2, and X4 switch to low following the input signal DATAIN=0.

The sizes of buffer stages and the transmission gates determine the speed at which signal lines 60, 61, 62, and 63 reach the outputs X1, X2, X3, and X4 of the selector 31. Hence, the sizes of transmission gates 603 and 614 and sizes of buffer stages 611 and 613 determine the response in the slew limit case and is kept small enough to prevent fast switching of the driver stage transistors that would otherwise cause large bounce in the power rail.

The sizes of transmission gates 604 and 615 and sizes of buffer stage 612 and 614 are kept large enough so that signal transmitted to the gate of the pull-up driver transistors is faster, but its size is limited by the amount of power bounce that is tolerable in the system. Sizes of transmission gates 605 and 616 are kept small enough to provide the desired skew between X1 and X2 and between X3 and X4. Similarly, proper sizing of transistors of circuits 52 and 53 determine the speed of additional pull-down of PX0, PX1 and PX3 for fast output option. The sizes of transistors 537, 538, and 539 are kept small enough to ensure that voltages at PX0, PX1 and PX3 rise slower than the voltage rise at PX2 and PX4.

The output buffer described herein is programmable for five different driving current values. But it should be clear that an output buffer with a lesser or higher number of driving strength options can be implemented using the output buffer described in the present invention.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

The invention claimed is:

1. A programmable output buffer providing variable drive strength and variable slew rate for a given noise limit, comprising:

a driver stage that generates the output of the buffer and includes a plurality of selectively enabled switching elements;

a predriver stage providing a plurality of selectable switching elements that enables the selected drive stage switching elements; and a selection means that enables the required predriver switching elements in a selectively variable sequence to provide the desired variable drive strength and variable slew rate responsive to an external capacitive load to control noise in the form of ground bounce and supply bounce.

2. The programmable output buffer of claim claim 1 wherein the number of selected driver stage switching elements is determined by the required drive strength, and their switching sequence is controlled to optimize the switching noise and delay.

3. The programmable output buffer of claim 1 wherein the number and sequence of selected switching elements in the predriver stage is determined by the combination of the desired variable drive strength and slew rate.

4. The programmable output buffer of claim 1 wherein the selection means comprises a bit pattern generator.

5. The programmable output buffer of claim 1 wherein the predriver stage comprises a pull down predriver stage driving pull down switching elements of the driver stage and a pull up predriver stage driving pull up switching elements of the driver stage.

6. The programmable output buffer of claim 1 wherein the sequential turning on of selected elements is achieved by selecting appropriate paths incorporating different delay elements.

7. The programmable output buffer of claim 5 wherein said pull up switching elements of the driver stage are parallel to each other and connected between a first terminal of a power supply and an output of the driver stage.

8. The programmable output buffer of claim 5 wherein said pull down switching elements of the driver stage are parallel to each other and connected between a second terminal of the power supply and the output of the driver stage.

9. The programmable output buffer of claim 7 wherein said switching elements are pass transistors with their control terminals separately connected to the output of said predrivers.

10. The programmable output buffer of claim 1 wherein said predriver includes a selector receiving inputs from the said selection means, data input, and first output lines, each output line further provided with additional circuitry for increasing and decreasing speed in order to supply a desired slew rate.

11. A method of providing a programmable output buffer having a variable drive strength and a slew rate for a given noise limit, comprising the steps of:

providing a driver stage that includes a plurality of selectively enabled switching elements for generating the output of the buffer;

connecting a predriver stage to a plurality of selectable switching elements that enables the selected driver stage switching elements; and enabling the required predriver switching elements in a selectively variable sequence to provide a desired variable drive strength and variable slew rate using a selection means responsive to an external capacitive load to control ground bounce noise and supply bounce noise.

12. The method of claim 11 comprising the step of determining the number of selected driver stage switching elements by the required drive strength and controlling the switching sequence to optimize the switching noise and delay.

13. The method of claim 11 further comprising the step of determining the number and sequence of selected switching elements in the predriver stage by the combination of the desired drive strength and slew rate.

14. The method of claim 11 including the step of connecting the pull up predriver stage to the pull up switching elements of the driver stage and a pull down predriver stage to the pull down switching elements of the driver stage.

15. The method of claim 11, further including the step of sequentially turning on selected switching elements by selecting appropriate paths incorporating different delay elements.

16. The method of claim 11 comprising the steps of connecting the pull up switching elements of the driver stage in parallel to each other between a first terminal of a power supply and an output of the driver stage.

17. The method of claim 11 including the steps of connecting pull down switching elements of the driver stage in parallel to each other between second terminal of the power supply and the output of the driver stage.

18. A programmable output buffer, comprising:
a driver stage having a plurality of selectively-enabled switching elements configured to generate an output signal that is the output of the buffer;
a pull-up predriver stage coupled to a first set of inputs in the driver stage;
a pull-down predriver stage coupled to a second set of inputs in the driver stage;
a bit pattern generator coupled to the pull-up predriver stage and the pull-down predriver stage and configured to generate a pattern of bits for selectively enabling selectable switching elements in the pull-up predriver stage and the pull-down predriver stage to provide a variable impedance and slew rate in response to a capacitive load; and
a plurality of configurable memory cells coupled to the bit pattern generator for selecting the pattern of bits for the pull-up predriver stage and the pull-down predriver stage to be generated by the bit pattern generator.

19. The buffer of claim 18 further comprising a control signal input and a slew rate input to the pull-up predriver and the pull-down predriver for receiving control and slew rate signals, respectively.

20. The buffer of claim 19 wherein the driver stage comprises a first set of PMOS transistors each having a control gate coupled to a respective input in the first set of inputs, and further comprising a plurality of NMOS transistors each having a control gate coupled to a respective input of the second set of inputs.

21. The buffer of claim 20 wherein the PMOS transistors are coupled in parallel between a voltage source and the output, and further wherein the plurality of NMOS transistors are coupled in parallel between a ground terminal and the output.

22. The buffer of claim 21 wherein the pull-up predriver stage comprises a pull-up drive strength and slew rate selector coupled to a first pull-down circuit and to a second pull-down circuit.

23. The buffer of claim 22 wherein the pull-down predriver stage comprises a pull-down drive strength and slew rate selector coupled to a first pull-up circuit and a second pull-up circuit.

24. A programmable output buffer, comprising:
a driver stage having a plurality of selectively-enabled switching elements configured to generate an output signal that is the output of the buffer;
a pull-up predriver stage coupled to a first set of inputs in the driver stage, the pull-up predriver stage comprising a pull-up drive strength and slew rate selector coupled to a first pull-down circuit and to a second pull-down circuit;
a pull-down predriver stage coupled to a second set of inputs in the driver stage;
a bit pattern generator coupled to the pull-up predriver stage and the pull-down predriver stage and configured to generate a pattern of bits for selectively enabling selectable switching elements in the pull-up predriver stage and the pull-down predriver stage; and
configurable memory cells coupled to the bit pattern generator for selecting the pattern of bits for the pull-up predriver stage and the pull-down predriver stage to be generated by the bit pattern generator.

25. The buffer of claim 24 wherein the pull-down predriver stage comprises a pull-down drive strength and slew rate selector coupled to a first pull-up circuit and a second pull-up circuit.

26. A programmable output buffer, comprising:
a driver stage having a plurality of selectively-enabled switching elements configured to generate an output signal that is the output of the buffer;
a pull-up predriver stage coupled to a first set of inputs in the driver stage;
a pull-down predriver stage coupled to a second set of inputs in the driver stage, the pull-down predriver stage comprising a pull-down driver strength and slew rate selector coupled to a first pull-up circuit and a second pull-up circuit;
a bit pattern generator coupled to the pull-up predriver stage and the pull-down predriver stage and configured to generate a pattern of bits for selectively enabling selectable switching elements in the pull-up predriver stage and the pull-down predriver stage; and
configurable memory cells coupled to the bit pattern generator for selecting the pattern of bits for the pull-up predriver stage and the pull-down predriver stage to be generated by the bit pattern generator.

27. The buffer of claim 26 wherein the pull-up predriver stage comprises a pull-up drive strength and slew rate selector coupled to a first pull-down circuit and to a second pull-down circuit.

28. A programmable output buffer providing variable drive strength and slew rate for a given noise limit, comprising:
a driver stage that generates the output of the buffer and includes a plurality of selectively enabled switching elements;
a predriver stage providing a plurality of selectable switching elements that enables the selected drive stage switching elements; and
a selection means that enables the required predriver switching elements in a selectively variable sequence to provide the desired variable drive strength and variable slew rate responsive to an external capacitive load, the sequential turning on of selected elements is achieved by selecting appropriate paths incorporating different delay elements to minimize ground bounce and supply bounce noise.

29. The programmable output buffer of claim 28 wherein a number of selected driver stage switching elements is determined by the required drive strength, and their switching sequence is controlled to optimize the switching noise and delay.

30. The programmable output buffer of claim 28 wherein a number and sequence of selected switching elements in the predriver stage is determined by the combination of the desired variable drive strength and slew rate.

31. The programmable output buffer of claim 28 wherein the selection means comprises a bit pattern generator.

32. A programmable output buffer providing variable drive strength and slew rate for a given noise limit, comprising:
- a driver stage that generates the output of the buffer and includes a plurality of selectively enabled switching elements;
- a predriver stage providing a plurality of selectable switching elements that enables the selected drive stage switching elements;
- a selection means that enables the required predriver switching elements in the desired sequence to provide the desired variable drive strength and slew rate responsive to an external capacitive load; and
- the predriver comprising a selector receiving inputs from the selection means, data input, and first output lines, each output line further provided with additional circuitry for increasing and decreasing speed in order to supply a desired slew rate.

33. The programmable output buffer of claim 32 wherein the number of selected driver stage switching elements is determined by the required drive strength, and their switching sequence is controlled to optimize the switching noise and delay.

34. The programmable output buffer of claim 32 wherein the number and sequence of selected switching elements in the predriver stage is determined by the combination of the desired variable drive strength and slew rate.

35. The programmable output buffer of claim 32 wherein the selection means comprises a bit pattern generator.

36. The programmable output buffer of claim 32 wherein the sequential turning on of selected elements is achieved by selecting appropriate paths incorporating different delay elements.

37. A method of providing a programmable output buffer having a variable drive strength and a slew rate for a given noise limit, comprising the steps of:
- providing a driver stage that includes a plurality of selectively enabled switching elements for generating the output of the buffer;
- connecting a predriver stage to a plurality of selectable switching elements that enables the selected driver stage switching elements;
- enabling the required predriver switching elements in a desired sequence to provide a desired variable drive strength and slew rate using a selection means responsive to an external capacitive load; and
- turning on selected switching elements in a selectively variable sequence by selecting appropriate paths incorporating different delay elements to minimize ground bounce and supply bounce noise.

38. The method of claim 37 comprising the step of determining the number of selected driver stage switching elements by the required drive strength and controlling the switching sequence to optimize the switching noise and delay.

39. The method of claim 37 further comprising the step of determining the number and sequence of selected switching elements in the predriver stage by the combination of the desired drive strength and slew rate.

40. The method of claim 37 comprising the step of connecting a pull up predriver stage to pull up switching elements of the driver stage and a pull down predriver stage to pull down switching elements of the driver stage.

* * * * *

UNITED STATES PATENT AND TRADEMARK OFFICE
CERTIFICATE OF CORRECTION

PATENT NO. : 7,205,786 B2
APPLICATION NO. : 10/832091
DATED : April 17, 2007
INVENTOR(S) : Adeel Ahmad

It is certified that error appears in the above-identified patent and that said Letters Patent is hereby corrected as shown below:

Column 18
Line 13, Claim 1 "The programmable output buffer of claim claim 1" should read as
-- The programmable output buffer of claim 1 --

Column 19
Line 45, Claim 19 "The buffer of claim 20 further comprising a control" should read as
-- The buffer of claim 20, further comprising a control --

Signed and Sealed this

Seventeenth Day of March, 2009

JOHN DOLL
*Acting Director of the United States Patent and Trademark Office*